United States Patent [19]

Flannagan

[11] 4,394,600
[45] Jul. 19, 1983

[54] LIGHT EMITTING DIODE MATRIX

[75] Inventor: Alfred Flannagan, Weston, Canada

[73] Assignee: Litton Systems, Inc., Beverly Hills, Calif.

[21] Appl. No.: 229,489

[22] Filed: Jan. 29, 1981

[51] Int. Cl.$^3$ .............................................. H01L 25/04
[52] U.S. Cl. ..................................... 313/500; 313/510
[58] Field of Search ....................... 313/500, 505, 510; 357/45

[56] References Cited

U.S. PATENT DOCUMENTS

| | | | |
|---|---|---|---|
| 2,994,121 | 8/1961 | Shockley | 29/25.3 |
| 3,471,923 | 12/1966 | Lamorte et al. | 29/572 |
| 3,501,676 | 3/1970 | Adler et al. | 313/500 X |
| 3,536,830 | 10/1970 | Hakki | 178/7.3 |
| 3,558,974 | 1/1971 | Stewart | 315/169 |
| 3,654,476 | 4/1972 | Hakki | 250/211 J |
| 3,800,177 | 3/1974 | Russ | 313/108 D |
| 3,812,406 | 5/1974 | Henri | 313/500 X |
| 3,840,769 | 10/1974 | Yamamoto et al. | 313/500 |
| 3,867,666 | 2/1975 | Nyul | 313/500 |
| 3,950,844 | 4/1976 | Wisbey | 29/577 |
| 3,997,907 | 12/1976 | Nakamura et al. | 357/17 |
| 4,007,396 | 2/1977 | Wisbey et al. | 313/500 |
| 4,016,449 | 4/1977 | Gale et al. | 313/500 |
| 4,241,281 | 12/1980 | Morimoto et al. | 313/500 X |

FOREIGN PATENT DOCUMENTS 1082378  7/1980  Canada .

OTHER PUBLICATIONS

Burnette, K. T.; Moffat, A. J.; Warebert P. G.; Multi-Mode Matrix (MMM) Modular Flight Display Development, Proceedings of SID, vol. 21/2, 1980, pp. 143-155.

Burnette, K. T.; Multi-Mode Matrix (MMM) Display Design and Measurement Criteria, Proceedings SID, vol. 21/2, 1980, pp. 127-142.

Burnette, K. T.; Melnick, W.; Multi-Mode Matrix (MMM) Flat-Panel LED Vector-Graphic Concept Demonstrator Display, Proceedings of SID, vol. 21/2, 1980, pp. 113-125.

Klass, P. J. LED Displays Being Evaluated by USAF, Aviation Week, vol. 110, p. 73, Jun. 18, 1979 Avionics.

*Primary Examiner*—Eugene La Roche
*Attorney, Agent, or Firm*—Roy L. Brown

[57] ABSTRACT

A matrix of light emitting diodes constructed of mosaic sectors each having a predetermined number of light emitting diodes, characterized by the cathode contacts of said diodes being outward, the cathodes being covered by conductors which have holes strategically placed so that the light emitted by said diodes is confined to small high intensity dots; said diodes having conductors positioned to connect to the anodes of said diodes and thermally connected to an anodized aluminum substrate which acts as a heat sink, the outer surface of said cathode conductors being blackened to absorb sunlight, and the exposed surface of said cathodes being nonreflective; a grid of optically and electrically insulative properties isolates and separates said diodes.

4 Claims, 7 Drawing Figures

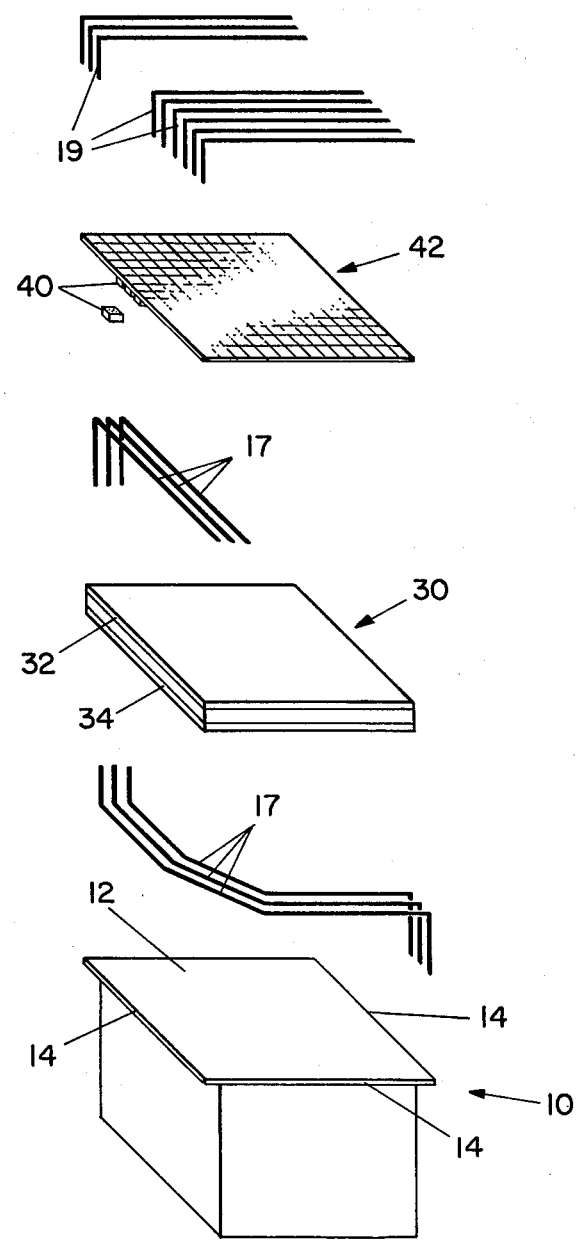

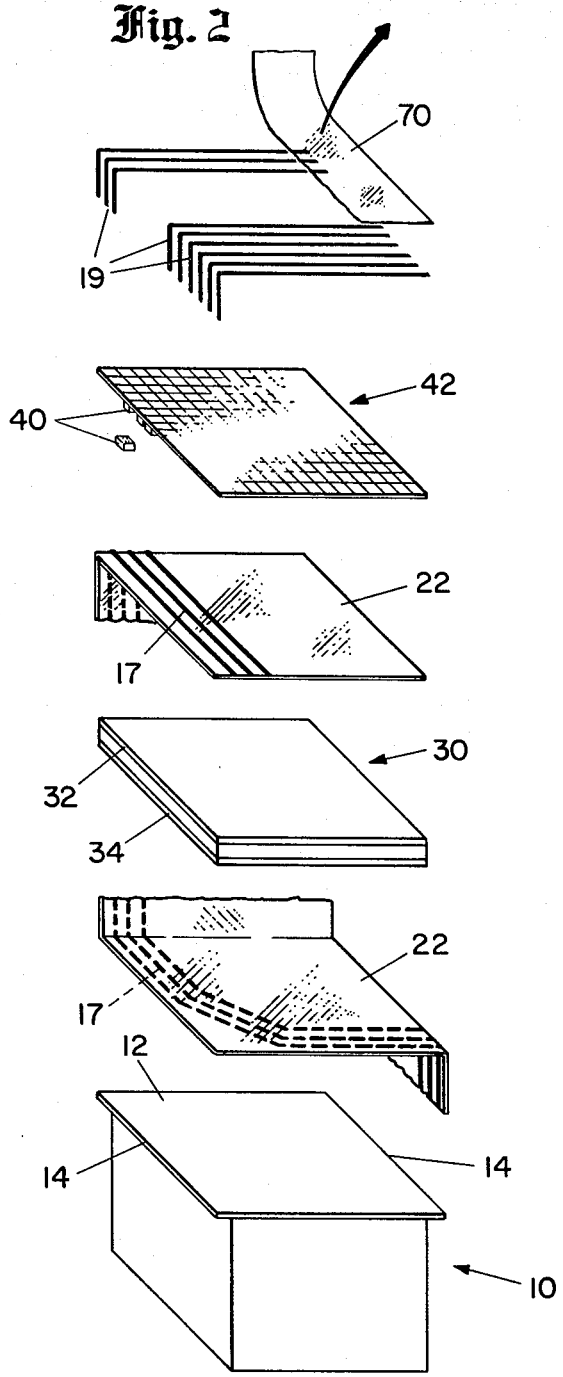

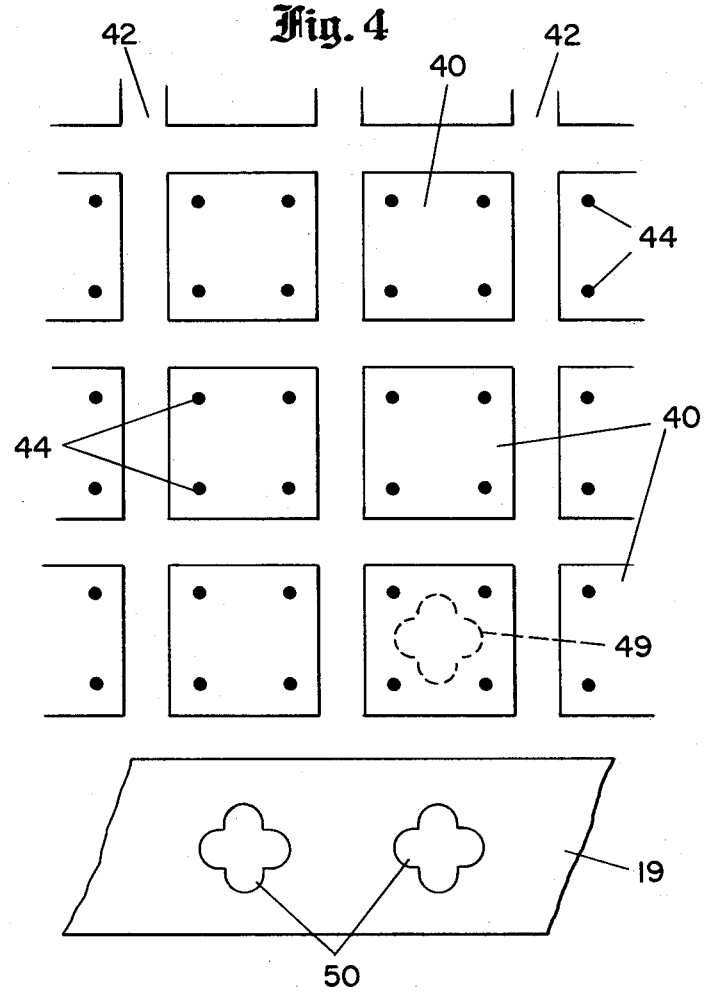

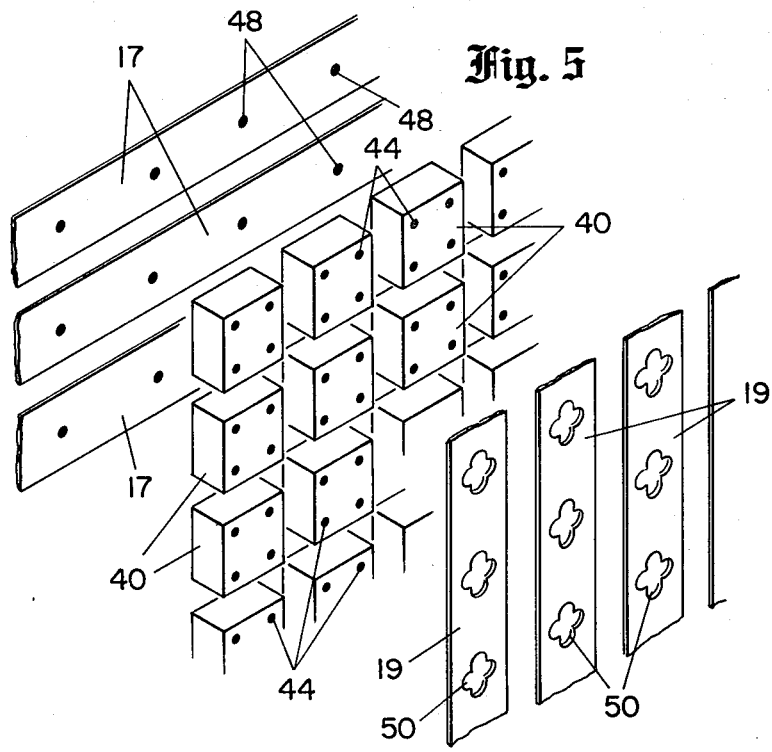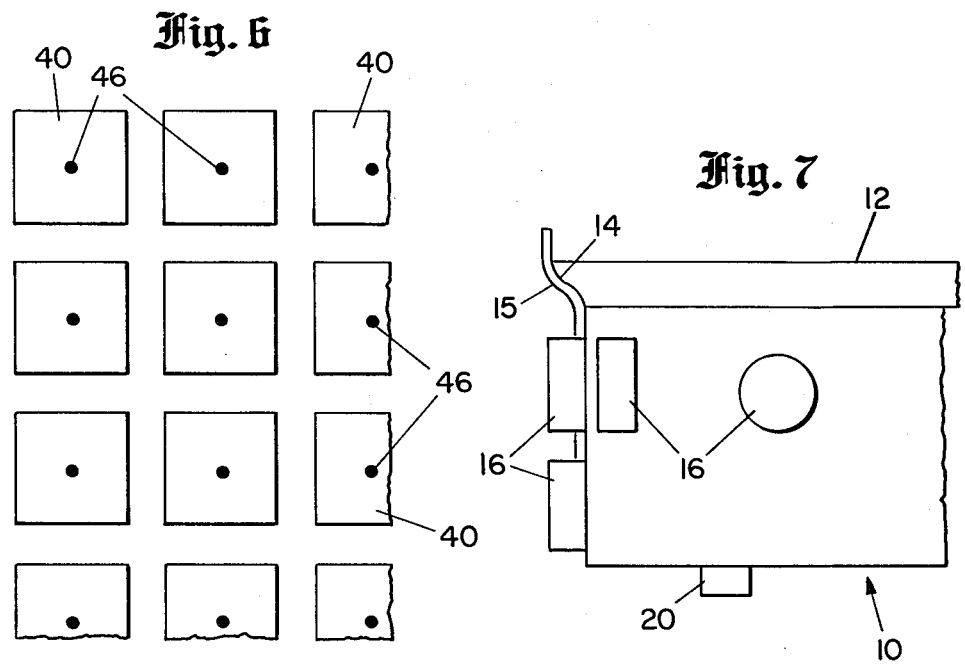

LIGHT EMITTING DIODE MATRIX

BACKGROUND OF THE INVENTION

Light emitting diodes are frequently used to present an alphanumeric display. When used in that fashion, a separate mosaic or matrix of light emitting diodes is typically used for each character. Light emitting diode patterns, or mosaic patterns, are frequently called a "matrix". The term matrix usually refers to a row-column arrangement, and it is not intended that the pattern should be limited to such a row-column configuration. When it is desired to present a picture on a large mosaic made of sectors of light emitting diode mosaics, it is necessary that the rows and columns of adjacent sectors be aligned and that the separation between diodes on adjacent sectors be the same as the separation between diodes within the sectors.

Existing diode mosaic sectors which are designed to present a picture have a diode spacing of about 32 to the inch. When it is attempted to create such mosaics with densities of 64 or 128 per inch to obtain better resolution, the driving of the rows and columns of the individual mosaic sectors becomes difficult or impossible.

Present light emitting diode matrices are mounted upon ceramic substrates which are costly to produce and prone to cracking.

Typically the mosaic is connected to a printed circuit board upon the surface of the ceramic substrate opposite the diode. Metalization of the circuit is typically either a gold ink or plated circuits which are restricted to a low thickness of, for example, 0.25 to 0.5 mil. Such circuits are preferably of gold which is costly both because of the price of gold and because the process used requires many steps.

Conventional light emitting diode mosaics have their anode contact on the outer surface and either total coverage of the rear cathode contacts or a large random dot pattern to permit silver epoxy mounting and wire bonding to the anode contact. The anode is typically in the center of the light emitting diode, and it obscures a large portion of the emitting light.

In the prior art it is customary to form monolithic chips of light emitting diodes, and then to sawcut or abrade the surface between the diodes to isolate the junctions.

It is customary to use a conductive epoxy to mount the light emitting diodes on the substrate. The anodes of the diodes are then stitch-bonded.

The conductors connecting the anodes are reflective, and a circular polarizer filter needs to be used to prevent scintillation. Such a filter typically has a transmittance of only about 25% which requires the diodes to be brighter in order to be seen in the presence of sun light. With a brighter light required, the diodes must dissipate more heat.

The diodes are typically mounted with a low density because of the requirement that the mosaic sectors be mounted in juxtaposition with the pitch between the outside rows and columns of adjacent mosaic sectors being the same as the column and row spacing between adjacent diodes within the mosaic.

It is usual to mount the row and column driver chips on the back of the substrate or between separate characters on the front of the substrate.

To avoid these enumerated problems and others, the apparatus of this invention has been conceived.

BRIEF SUMMARY OF THE INVENTION

The light emitting diodes, in accordance with this invention, are mounted upon a heat sink. The heat sink preferably is an anodized aluminum plate. The anodizing acts as an electrical insulator while conducting heat.

Copper lead frames are positioned to extend over the side of each of the mosaic sectors upon a flexible film. A typical film, such as a polyimide film, could be used is sold under the trademark "Kapton". The copper is tinned instead of gold plated. Cementing the conductors on the flexible film allows for differential expansion. Even with a diode density of 64 or 128 diodes per inch, the conductors on the flexible film can be relatively thick, on the order of two or three mils, to reduce resistance drop.

The light emitting diodes are preferably positioned with the cathode surface outward. An antireflective coating is applied to the exposed area of the light emitting diode and also to the outer surface of the cathode conductors. Because no polarizer is required to avoid scintillation, the light intensity can be reduced, and each pixel may still be viewed in sun light.

Discrete light emitting diodes may be used which produce a more efficient light for a given amount of excitation. Further, the light emitting diodes may be annealed after assembly into a mosaic to enhance the luminance.

An insulated grid is positioned on the substrate, and the individual diodes are positioned in the matrix created by that grid. Optical coupling between adjacent diodes is reduced by the grid and also the luminance is enhanced by focussing light from the light emitting diode.

A conductive epoxy or solder bumps are used to contact the anodes and cathodes of the diodes.

Because of the nonreflective outer surface which is blackened, and because of the elimination of stitch-bonding, the polarizer is not needed, and the driver power may be reduced. The cathode conductors have holes therein to form the light mask to allow light from the individual diodes to shine through. Further, the cathode conductors form an electromagnetic-interference shield and also mechanical protection for the diodes.

The apparatus contemplated by this invention, therefore, allows a high density display of pictures, vector graphics and alphanumerics.

It is therefore an object of this invention to provide a new light emitting diode mosaic structure.

It is a more specific object of this invention to provide such a structure which requires no polarizer and less driving power for a given illumination intensity.

It is also an object of this invention to pack light emitting diodes into a high resolution display.

It is also an object of this invention to provide a light emitting diode matrix having a high yeld.

Other objects will become apparent from the following description, taken together with the accompanying drawings.

BRIEF DESCRIPTION OF THE DRAWINGS

FIG. 1 is an exploded view of a preferred assembly according to this invention;

FIG. 2 is an exploded view of a second assembly according to this invention;

FIG. 3 is an oblique view of a typical discrete light emitting diode;

FIG. 4 is a large scale view of a portion of the light emitting diode matrix showing the cathode side of the diodes and a single column conductor contacting diode cathodes;

FIG. 5 is a large scale exploded view of a portion of the light emitting diodes, column connectors for contacting the cathodes, and row connectors for contacting the anodes;

FIG. 6 is a large scale view of the light emitting diodes and the anodes thereof; and FIG. 7 is a view of the edge of the top of the heat sink.

DETAILED DESCRIPTION OF THE INVENTION

The apparatus shown in FIGS. 1 and 2 typically forms a mosaic of light emitting diodes having dimensions on the order of one inch square. It may, of course, have smaller or larger dimensions. The density of diodes is typically 32 or 64 diodes per inch. A density of 128 per inch is also practical. It is also typical to have a density of 62.5 per inch which requires a pitch of 0.016 inches. A density of 64 diodes per inch requires a spacing of 0.015625 inches. A density of 128 diodes per inch requires a spacing of 0.0078125 inches. It is easier to space the diodes at 0.016 inches (0.4 mm) and 0.008 inches (0.2 mm), respectively.

In FIGS. 1 and 2, a metal heat sink 10 (preferably of hard anodized aluminum) in the general shape of a parallelepiped having a flat top 12 is preferable. The edge of the top is contoured, as shown in FIG. 7 at 14, to ease the bending of conductors 15 which attach to components 16 which are typically positioned on the side surface of the heat sink 10. The conductors 15 of FIG. 7 are typically the row conductors 17 or the column conductors 19. The components 16 may, for example, be row or column drivers, resistors, capacitors, or some other discrete component. The post 20 is typical of pins or posts which are used to position and secure the heat sink 10 onto a base (not shown) in proper alignment with abutting adjacent mosaics.

In the embodiment of FIG. 2 a plastic flexible sheet 22 having row connectors 17 on the underside thereof is attached, typically using insulating cement, to the top 12 of the heat sink 10. In the embodiment of FIG. 1, the row conductors 17 are attached, as by cementing, to the top 12, and the sheet 22 (not shown in the preferred embodiment) is stripped away leaving only the conductors 17. The conductors 17 typically wrap over the edge and connect to driver circuits shown generally at 16 in FIG. 7.

The diode substrate may be, for example, ceramic, but it is preferably hard anodized aluminum. The aluminum substrate 30 has anodized aluminum surfaces 32, 34 which are preferably from 0.1 to 0.3 mils thick and are colored black.

In the embodiment of FIG. 2 the plastic sheet 22 and conductors 17 wrap over an edge of the substrate 30. In the embodiment of FIG. 1 the plastic sheet is removed, leaving only the row conductors 17.

In the embodiment of FIG. 2 the sheet 22 is attached, as by cementing, to the anodized surfaces 32, 34. In the embodiment of FIG. 1 the sheet 22 is removed, and only the conductors 17 are left to be cemented to the surfaces 32, 34.

A plurality of light emitting diodes 40 are positioned in the openings of an insulating grid 42 as shown more particularly in FIG. 4. Each of the diodes 40 has either two or four contacts 44 positioned adjacent to the corners of the cathode surface as shown in FIGS. 3, 4 and 5. The anode surfaces, as shown in FIG. 6, each have a single anode contact 46. As shown in FIGS. 1, 2 and 5, the anode surfaces of the diodes 40 face the row conductors 17, and each row conductor contacts a row of anodes 46 of the diodes 40. The anodes 46 may be welded, soldered or attached with conductive cement to the row conductors 17. FIG. 5 shows a plurality of precisely positioned solder dots 48 positioned to contact the anodes 46 of the diodes 40, and the dots 48 are heated to connect to the anodes 46.

The light emitting diode 40, as shown in FIG. 3, is typically substantially cubical.

A plurality of column conductors 19 are positioned on top of the matrix of diodes 40 with the conductors contacting the cathode contacts 44. In the regions of the cathode surfaces not containing the contacts 44, the cathode surface is disclosed through openings 50 formed in the column conductors 19.

The openings 50 are in the general shape of a cross so that most of the illuminated region of the cathode surfaces is exposed as shown by the dotted line 49 in FIG. 4.

The grid 42 may be of any suitable insulating material, but black-anodized aluminum is preferred. Such material prevents light coupling between adjacent diodes and is an insulator to prevent electrical coupling.

The outside of the column conductors 19, including the interior of the edges of the openings 50, are preferably covered with a dull black material such as, for example, Roblack to make these surfaces nonreflective.

Connections required wherein electrical conduction is required may be made by conductive epoxy such as, for example, silver or gold. Where insulation is required, an insulative epoxy may be used.

The electrodes 44, 46 on the diodes 40 are, typically, fabricated of gold or aluminum.

In both the embodiment of FIGS. 1 and 2, the plastic sheet 70 is peeled away leaving the column conductors cemented to the cathode terminals 44.

Although the invention has been described above, it is not intended that the invention shall be limited by the description except in combination with the recitations with the claims.

What is claimed is:

1. In a light emitting diode matrix, a substrate having, in order, first, second, third, and fourth adjacent edges; a first plurality of light emitting diodes, each having an anode electrode centered on its anode end face and a plurality of cathode electrodes positioned around the periphery of its cathode end face, arranged in rows and columns of a rectangular coordinate system; a second plurality of row conductors, equal in number to the number of rows of said diodes, each electrically contacting the anode electrodes of said diodes of its respective row; a third plurality of column conductors, equal in number to the number of said columns of diodes, each electrically contacting the cathode electrodes of its respective column and thence extending over said first edge of said substrate; said anodes and said row conductors being positioned upon a first surface of said substrate, with said anodes directed toward said substrate, with said column conductors contacting said cathode electrodes on the outer surface of said matrix and each having a fourth, equal to said second plurality of row conductors, plurality of openings formed therein and positioned over the non-electrode portions of the cathode surfaces of said diodes; the improvement comprising:

said row conductors extending in rows along said first surface of said substrate, thence over said second edge of said substrate, thence extending in rows from said second edge on the second surface of said substrate, the positions of said row conductors on said second surface being contoured to turn through a right angle, and thence to said third edge of said substrate.

2. Apparatus as recited in claim 1 in which a heat sink is thermally attached on one surface thereof to at least said row conductors, including row and column driver electronics supported on said heat sink; the improvement further comprising:

said row conductors and said column conductors being attached to opposite edges of said heat sink and thence to said row and column driver electronics, respectively.

3. Apparatus as recited in claim 1, the improvement further comprising:

a light absorbing coating on the outer surface of said column conductors, and an anti-reflective coating over at least the exposed cathode surfaces of said diodes.

4. Apparatus as recited in claim 3 in which the improvement further comprises:

the side surfaces of the individual said diodes are electrically and optically isolated by an opaque and electrically insulative grid.

* * * * *